US012808943B2

(12) United States Patent
Zhou et al.

(10) Patent No.: US 12,808,943 B2
(45) Date of Patent: Nov. 24, 2026

(54) METHOD, APPARATUS, MEDIUM AND ELECTRONIC DEVICE FOR IDENTIFYING DEGRADATION DEGREE OF BATTERY

(71) Applicant: Makesense Energy Technology Co., Limited, Shanghai (CN)

(72) Inventors: Guopeng Zhou, Shanghai (CN); Xiaohua Chen, Shanghai (CN); Enhai Zhao, Shanghai (CN); Xiao Yan, Shanghai (CN); Pei Song, Shanghai (CN); Jian Zhao, Shanghai (CN); Zonglin Cai, Shanghai (CN); Peng Ding, Shanghai (CN)

(73) Assignee: Makesense Energy Technology Co., Limited., Shanghai (CN)

( * ) Notice: Subject to any disclaimer, the term of this patent is extended or adjusted under 35 U.S.C. 154(b) by 0 days.

(21) Appl. No.: 18/575,323

(22) PCT Filed: Jun. 29, 2023

(86) PCT No.: PCT/CN2023/103652

§ 371 (c)(1),
(2) Date: Dec. 29, 2023

(87) PCT Pub. No.: WO2024/087706

PCT Pub. Date: May 2, 2024

(65) Prior Publication Data

US 2025/0251460 A1 Aug. 7, 2025

(30) Foreign Application Priority Data

Oct. 26, 2022 (CN) ......................... 202211320351.1

(51) Int. Cl.

| | |
|---|---|
| ***G01R 31/392*** | (2019.01) |
| ***G01R 31/367*** | (2019.01) |
| ***G01R 31/3835*** | (2019.01) |

(52) U.S. Cl.

CPC ......... *G01R 31/392* (2019.01); *G01R 31/367* (2019.01); *G01R 31/3835* (2019.01)

(58) Field of Classification Search

CPC ................ G01R 31/392; G01R 31/367; G01R 31/3835; G01R 31/36; Y02E 60/10

See application file for complete search history.

(56) References Cited

U.S. PATENT DOCUMENTS

2005/0046387 A1* 3/2005 Aker ......................... H02J 7/02 320/125
2008/0272736 A1* 11/2008 Tien .......................... H02J 7/56 320/132
2014/0015475 A1* 1/2014 Nakao ................. H01M 10/425 320/103

FOREIGN PATENT DOCUMENTS

CN 105572601 A 5/2016
CN 106324508 A 1/2017

(Continued)

OTHER PUBLICATIONS

Machine translation of CN106324508B to Huawei Technologies Co. Ltd (Year: 2017).*

*Primary Examiner* — Mischita Henson
(74) *Attorney, Agent, or Firm* — IPRTOP LLC

(57) ABSTRACT

A method, apparatus, medium and electronic device for identifying degradation degree of battery. The method includes: acquiring battery data corresponding to a current cycle count, wherein the battery data comprise battery capacities and battery voltages of the battery; acquiring, based on the battery capacities and the battery voltages, capacity differences corresponding to the battery voltages; acquiring, based on the battery voltages and the capacity differences, a surge set of the capacity differences and a voltage set corresponding to the surge set; and identifying a degree of the battery degradation based on the surge set and (Continued)

the voltage set, to obtain an identification result related to the current cycle count. The method can identify the degree of battery degradation without applying other specialized testing equipment, thereby reducing the cost of identifying the degree of degradation, thereby simplifying the process.

9 Claims, 7 Drawing Sheets

(56) References Cited

FOREIGN PATENT DOCUMENTS

| | | | |
|---|---|---|---|
| CN | 112180258 | A | 1/2021 |
| CN | 112198434 | A | 1/2021 |
| CN | 112834946 | A | 5/2021 |
| CN | 113030744 | A | 6/2021 |
| CN | 113884900 | A | 1/2022 |
| CN | 115210594 | A | 10/2022 |
| CN | 115629325 | A | 1/2023 |
| JP | 2022007946 | A | 1/2022 |

* cited by examiner

METHOD, APPARATUS, MEDIUM AND ELECTRONIC DEVICE FOR IDENTIFYING DEGRADATION DEGREE OF BATTERY

FIELD OF THE INVENTION

The present disclosure generally relates to the field of batteries, and in particular, relates to a method, apparatus, medium and electronic device for identifying a degradation degree of a battery.

BACKGROUND OF THE INVENTION

In recent years, due to their unique advantages, lithium-ion batteries have emerged as the leading technology for energy storage stations in countries like China. Lithium-ion batteries have become the preferred energy source for new-energy vehicles and energy storage power stations due to their high energy density and long life cycle. However, as lithium-ion batteries are used over a period of time, their storage capacity significantly decreases, which greatly limits their performance. Current methods for analyzing the degradation involve specialized testing equipment. Moreover, these methods require the battery to be fully charged or discharged before analysis can take place. This leads to high costs and a complex analysis process.

SUMMARY OF THE INVENTION

In view of the above-described shortcomings of the related technologies, the present disclosure provides method, apparatus, medium and electronic device for identifying a degree of battery degradation. The disclosed technique resolves problems such as high costs and complex analysis process in the current methods for analyzing the battery degradation.

The method includes: acquiring battery data related to a current cycle count, wherein the battery data comprise battery capacities and battery voltages; acquiring, based on the battery capacities and the battery voltages, capacity differences corresponding to the battery voltages; acquiring, based on the battery voltages and the capacity differences, a surge set of the capacity differences and a voltage set corresponding to the surge set; and identifying the degree of the battery degradation based on the surge set and the voltage set, and obtaining an identification result related to the current cycle count.

In some examples, the battery voltages increase incrementally by a voltage unit, and wherein acquiring the capacity differences is performed when the battery voltages increase incrementally by the voltage unit.

In some examples, identifying the degree of the battery degradation further comprises: performing a fitting process on the surge set and the voltage set to acquire a fitted slope of the battery related to the current cycle count; and wherein obtaining the identification result related to the current cycle count is performed based on the fitted slope and a benchmark slope of the battery.

In some examples, wherein the fitted slope is obtained by the following formula:

$$Q = m_1 \times U + m_0$$

herein, $U_1$ is a difference-surge-initiation voltage, and $U_2$ is a maximum-difference voltage, $Q_{diff}$ is a capacity difference in the surge set, $m_1$ is the fitted slope, and $m_0$ is a fitting parameter of the battery.

In some examples, obtaining the identification result related to the current cycle count further comprises: acquiring a degradation coefficient of the battery related to the current cycle count based on the fitted slope and the benchmark slope, wherein the degradation coefficient is provided by:

$$k = \frac{m_1}{m_b},$$

wherein k denotes the degradation coefficient, $m_1$ denotes the fitted slope, and $m_b$ denotes the benchmark slope; and wherein obtaining the identification result related to the current cycle count is further performed based on the degradation coefficient of the battery related to the current cycle count.

In some examples, obtaining the identification result related to the current cycle count further comprises: acquiring a degradation coefficient of the battery related to the current cycle count based on the fitted slope and the benchmark slope, wherein the degradation coefficient is provided by:

$$k = \frac{m_1}{m_b},$$

herein k denotes the degradation coefficient, $m_1$ denotes the fitted slope, and $m_b$ denotes the benchmark slope; and wherein obtaining the identification result related to the current cycle count is further performed based on the degradation coefficient of the battery related to the current cycle count.

In some examples, identifying the degree of the battery degradation comprises: acquiring an accumulated value of the capacity differences in the surge set; and obtaining the identification result related to the current cycle count based on the accumulated value of the capacity differences in the surge set.

In some examples, acquiring the battery data related to the current cycle count comprises: acquiring battery currents at different moments; acquiring accumulated battery-capacity changes at the different moments, based on the battery currents at the different moments, wherein one of the accumulated battery-capacity changes at a moment t is given by:

$$Q_t = \sum_{k=2}^{t} \frac{i_k + i_{k-1}}{2} \times \Delta t_k$$

herein $i_k$ is a battery current at a moment k, $i_{k-1}$ is the battery current at a moment k−1, and $\Delta_{t_k}$ is a sampling interval between the moment k and the moment k−1, wherein $k \leq t$.

An apparatus for identifying a degree of a battery degradation in a battery simulation system is also disclosed, the apparatus includes: a battery data acquisition module, for acquiring battery data related to a current cycle count, wherein the battery data comprise battery capacities and battery voltages of the battery; a capacity difference acquisition module, for acquiring capacity differences related to the battery voltages based on the battery capacities and the battery voltages; a surge set acquisition module, for acquiring a surge set of the capacity differences and a voltage set corresponding to the surge set, based on the battery voltages and the capacity differences; and a degree of battery degradation identification module, for identifying the degree of the battery degradation based on the surge set and the voltage set, wherein an identification result related to the current cycle count is acquired.

A non-transitory computer-readable storage medium, which stores a computer program, when the computer program is executed by a processor, the method for identifying the degree of the battery degradation is implemented.

An electronic device is disclosed which includes a memory, wherein a computer program is stored in the memory; and a processor, communicatively connected to the memory, the processor is configured to call the computer program to perform the method for identifying the degree of the battery degradation.

As described above, the method, apparatus, medium and electronic device for identifying the degree of the battery degradation of the present disclosure provide the following beneficial effects:

The method includes: acquiring battery data corresponding to a current cycle count, wherein the battery data comprise battery capacities and battery voltages of the battery; acquiring, based on the battery capacities and the battery voltages, capacity differences corresponding to the battery voltages; acquiring, based on the battery voltages and the capacity differences, a surge set of the capacity differences and a voltage set corresponding to the surge set; and identifying a degree of the battery degradation based on the surge set and the voltage set, to obtain an identification result related to the current cycle count. By processing the battery data related to the current cycle count to acquire the surge set and the voltage set, and identifying the degree of the battery degradation based on the surge set and the voltage set, it is possible to identify the degree of the battery degradation without the need for other specialized testing equipment, thereby reducing the cost of identifying the degree of the battery degradation, and simplifying the identification process.

In addition, traditional methods require the battery to be fully charged or discharged before analysis can take place, whereas the method for identifying the degree of the battery degradation of the present disclosure does not have such limitations because the surge set described in the present disclosure is in the normal operation range of the battery. To ensure battery safety, batteries are typically not fully charged or discharged during later stages of use. Therefore, the method for identifying the degree of the battery degradation of the present disclosure is more applicable to real-world scenarios.

REFERENCE NUMERALS

Figure 1:
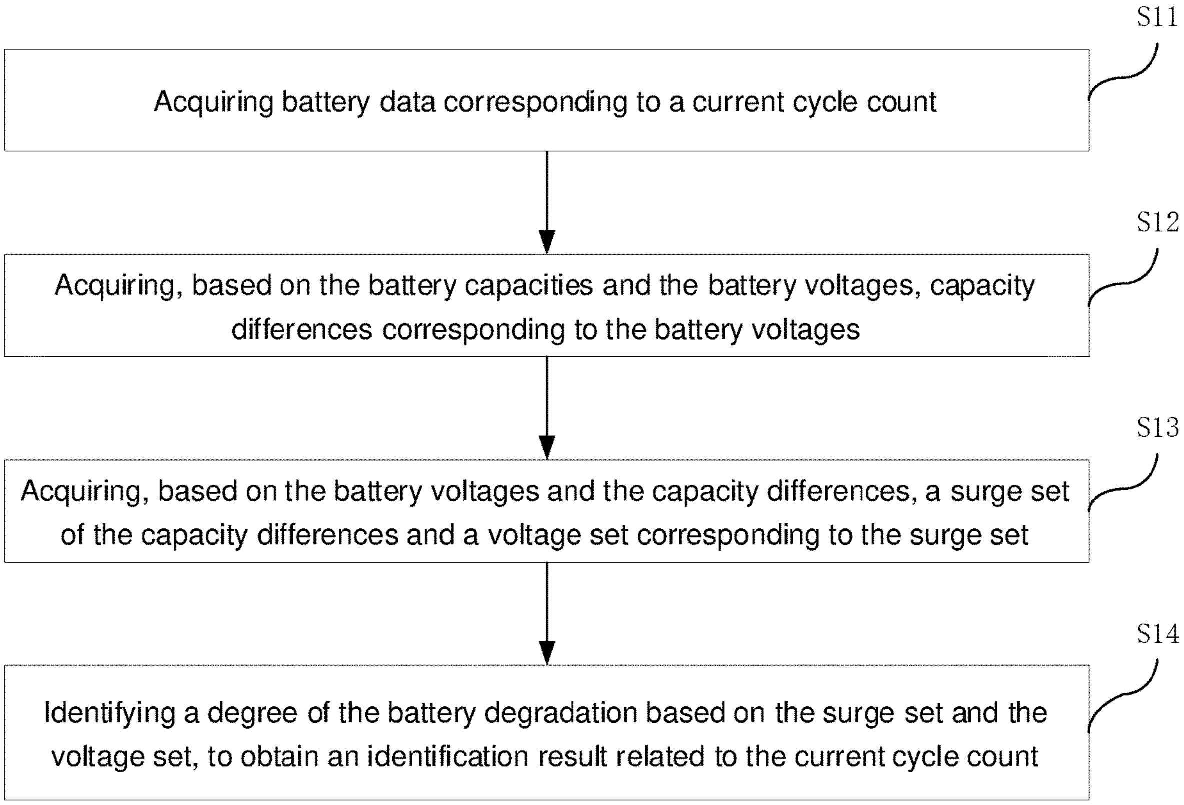
FIG. 1 shows a flowchart of a method for identifying a degree of a battery degradation according to an embodiment of the present disclosure.

900 Apparatus for Identifying Degree of Battery Degradation
910 Battery Data Acquisition Module
920 Capacity Difference Acquisition Module
930 Surge Set Acquisition Module
940 Degree of Degradation Identification Module
1000 Electronic Device
1010 Memory
1020 Processor
S11-S14 Steps
S21-S22 Steps
S31-S32 Steps
S41-S42 Steps
S51-S52 Steps

DETAILED DESCRIPTION

The embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. It should be noted that the following embodiments and the features of the following embodiments can be combined with each other if no conflict will result.

It should be noted that the drawings provided in this disclosure only illustrate the basic concept of the present disclosure in a schematic way, so the drawings only show the components closely related to the present disclosure. The drawings are not necessarily drawn according to the number, shape, and size of the components in actual implementation; during the actual implementation, the type, quantity, and proportion of each component can be changed as needed, and the components' layout may also be more complicated.

Current methods for analyzing this degradation involve specialized testing equipment. Moreover, these methods require the battery to be fully charged or fully discharged before analysis can take place. This leads to high costs and a complex analysis process. The method includes: acquiring battery data corresponding to a current cycle count, wherein the battery data comprise battery capacities and battery voltages; acquiring, based on the battery capacities and the battery voltages, capacity differences corresponding to the battery voltages; acquiring, based on the battery voltages and the capacity differences, a surge set of the capacity differences and a voltage set corresponding to the surge set; and identifying a degree of the battery degradation based on the surge set and the voltage set, to obtain an identification result related to the current cycle count. By processing the battery data related to the current cycle count to acquire the surge set and the voltage set, and identifying the degree of the battery degradation on the basis of the surge set and the voltage set, it is possible to identify the degree of the battery degradation without any other specialized testing equipment, thereby reducing the cost of identifying the degree of the battery degradation, and simplifying the identification process.

In addition, traditional methods require the battery to be fully charged or fully discharged before analysis can take place, whereas the disclosed method for identifying the degree of the battery degradation of the present disclosure does not have such limitations because the surge set described in the present disclosure is in the normal operation range of the battery. To ensure battery safety, batteries are typically not fully charged or fully discharged during later stages of use. Therefore, the method for identifying the degree of the battery degradation of the present disclosure is more applicable to real-world scenarios.

Referring to FIG. 1, in an embodiment of the present disclosure, the method for identifying the degree of the battery degradation specifically comprises:

- S11, acquiring battery data corresponding to a current cycle count, wherein the battery data comprise battery capacities and battery voltages;

Optionally, different battery data herein may respond to different cycle counts, with one cycle being a complete charge/discharge cycle; for example, the battery data may be obtained when the battery has reached 100 complete charge/discharge cycles, or when the battery has reached 1,000 complete charge/discharge cycles, or when the battery has reached 2,000 complete charge/discharge cycles. The battery data may be obtained when the battery in a charging state or in a discharging state. Furthermore, for the sake of brevity, the qualifier "related to the current cycle count" may be omitted from the terms "battery capacities", "battery voltages", "surge set", "voltage set", etc. Also, the term "cycle" may or may not refer to a complete charging/discharging cycle, as long a "surge set" detailed below may be obtained within such a "cycle".

Optionally, acquiring the battery data related to the current cycle count may include: receiving an initial charge state of the battery, battery currents at different moments, and battery voltages at different moments, which are all collected by a corresponding battery management system; and acquiring the battery capacities based on the initial charge state and the battery currents at different moments. Battery capacity may refer to the amount of electricity dischargeable by a battery or may refer to a State of Charge (SOC) of the battery.

Optionally, the battery capacities may be in the form of a set, and the battery voltages may be also in the form of a set. The battery capacities and the battery voltages correspond to each other, which means, the capacity and the voltage collected at the same moment form a pair; for example, the battery capacities include 200 mAh, 300 mAh, and 400 mAh, wherein 200 mAh is a battery capacity at the sampling moment of 1.5 s (second), 300 mAh is a battery capacity at the sampling moment of 2 s, and 400 mAh is a battery capacity at the sampling moment of 2.5 s, and the battery voltages include 3.7V, 3.8V, and 3.9V, wherein 3.7V is a battery voltage at the sampling moment of 1.5 s, 3.8V is a battery voltage at the sampling moment of 2 s, and 3.9V is a battery voltage at the sampling moment of 2.5 s; the battery capacity of 200 mAh is the battery capacity corresponding to the battery voltage of 3.7V; the battery capacity of 300 mAh is the battery capacity corresponding to the battery voltage of 3.8V; and the battery capacity of 400 mAh is the battery capacity corresponding to the battery voltage of 3.9V.

Preferably, acquiring the battery data related to the current cycle count further comprises: when multiple battery voltages collected at different moments are the same, retaining the one last collected by the battery management system. For example, when the battery management system collects multiple occurrences of 3.14V at 1 s, 1.2 s, 1.4 s respectively after starting sampling, the battery voltage collected by the battery management system at 1.4 s is retained (and the other ones may be discarded) By retaining only the last battery voltage among multiple identical voltages collected by the battery management system, the availability and accuracy of the battery data in subsequent identification processes can be ensured.

Preferably, the battery management system is provided with a built-in chip, and the built-in chip is used to collect the battery data.

S12, acquiring, based on the battery capacities and the battery voltages, capacity differences corresponding to the battery voltages.

Optionally, the correspondence between the capacity differences and the battery voltages may be expressed by the following formula:

$$Q_{diff} = Q_{U_k} - Q_{U_{k-1}}$$

$Q_{U_k}$ denotes the battery capacity corresponding to the battery voltage of $U_k$, $U_k$ denotes the battery voltage at the sampling moment of k, $Q_{U_{k-1}}$, denotes the battery capacity corresponding to the battery voltage of $U_{k-1}$, $U_{k-1}$ denotes the battery voltage at the sampling moment of k−1, and $Q_{diff}$ denotes the capacity difference between the battery voltage of $U_k$ And the battery voltage of $U_{k-1}$. For example, the battery voltages include 3.7V, 3.75V and 3.8V, and the battery capacities corresponding to these battery voltages include 200 mAh, 220 mAh and 250 mAh, then the capacity difference between the battery voltage of 3.75V and 3.7V is 20 mAh, the capacity difference between the battery voltage of 3.8V and 3.85V is 30 mAh, and the capacity differences may be in the form of a set, values of the elements in the capacity difference set are in one-to-one correspondence with the elements in the battery voltage set.

Optionally, acquiring the capacity differences corresponding to the battery voltages include: based on a voltage unit, the battery capacities, and the battery voltages, acquiring the capacity differences corresponding to the battery voltages which increase incrementally by the voltage unit. The correspondence between the incrementally increasing battery voltages and the capacity differences may be expressed by the following formula:

$$Q_{diff\_U_{unit}} = Q^{k}_{U_{unit\_}} - Q^{k-1}_{U_{unit\_}}$$

$U_{unit}$ denotes the voltage unit, $Q_{U_{unit}\_k-1}$ denotes the battery capacity when the battery voltage has incremented by the voltage unit for the (k−1)th time, $Q_{U_{unit}\_k}$ denotes the battery capacity when the battery voltage has incremented by the voltage unit for the kth time, $Q_{diff\_U_{unit}\_k}$ denotes the capacity difference when the battery voltage has incremented by the voltage unit for the kth time. Naturally, there is a corresponding battery voltage after each incremental change, for example, when the voltage unit is 0.02V, if the battery voltage after the (k−1)th incremental change is 3.35V, then the battery voltage after the kth incremental change is 3.37V, in which case if the battery capacity corresponding to 3.37V is 220 mAh, and the battery capacity corresponding to 3.35V is 200 mAh, then, 20 mAh is the capacity difference corresponding to the voltage of 3.37V if the voltage unit as 0.02V, i.e., the capacity difference corresponding to the battery voltage after the kth incremental change has the step of 0.02V.

Optionally, the voltage unit can be adjusted according to the actual situation. For example, when the battery voltages include 3.7V, 3.72V, 3.75V, 3.8V, the voltage unit can be 0.5V. In this case, the capacity difference corresponding to 3.75V may be the difference between the battery capacity corresponding to 3.75V and the chosen battery capacity corresponding to 3.7V (although it can be 3.72V), and the capacity difference corresponding to 3.8V may be the difference between the battery capacity corresponding to 3.8V and the battery capacity corresponding to 3.75V. By configuring the voltage unit, it can be ensured that the capacity differences corresponding to different battery voltages be obtained based on a consistent voltage increment, thereby improving the accuracy of identifying the degree of the battery degradation.

S13, acquiring, based on the battery voltages and the capacity differences, a surge set of the capacity differences and a voltage set corresponding to the surge set.

Figure 2:
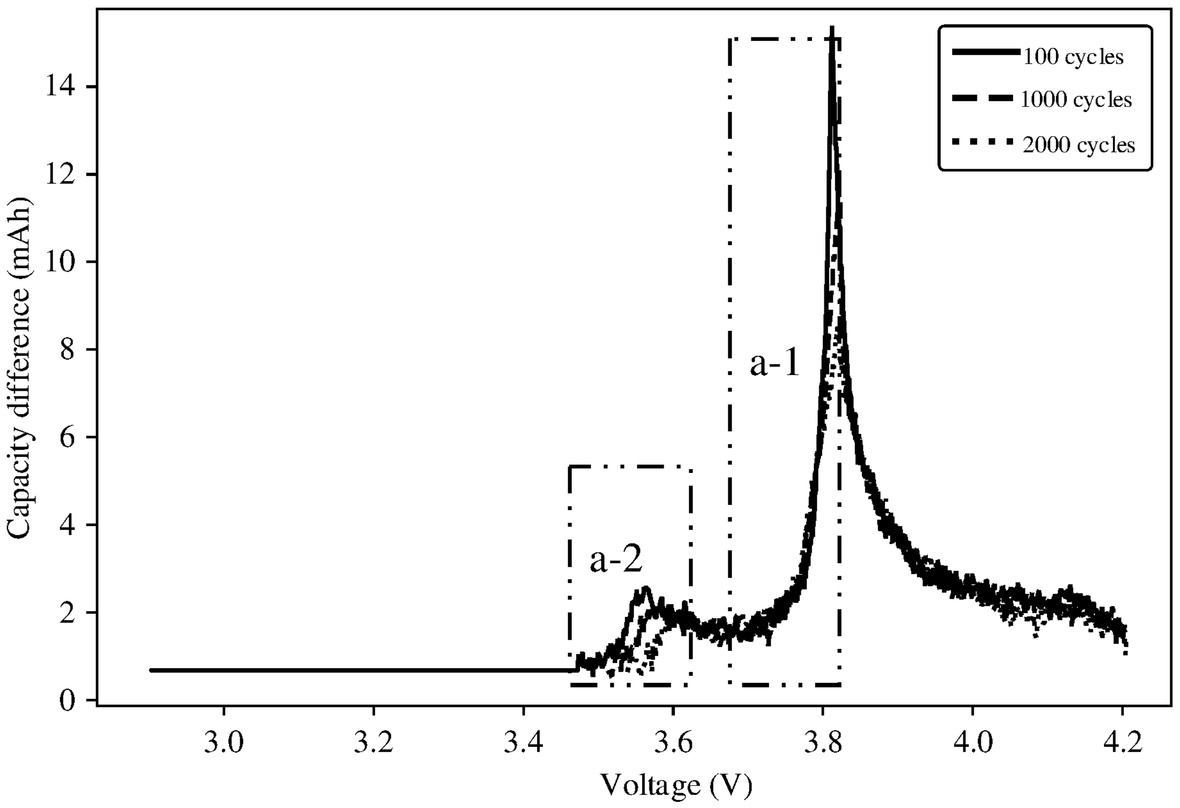
FIG. 2 shows a capacity difference versus voltage graph corresponding to different battery cycle counts according to an embodiment of the present disclosure.

Optionally, the surge set of the capacity differences may be a sub-set of a segment of the capacity differences that changes relatively fast; for example, when the capacity differences include 21 mAh, 22 mAh, 22 mAh, 25 mAh, 30 mAh, and 29 mAh, the sub-set of 22 mAh, 25 mAh, and 30 mAh may the surge set that changes faster than other parts of the capacity differences; for better understanding, the surge set may also be described as a set of surging capacity differences, or a set of capacity differences with sudden or abrupt changes; the voltage set corresponding to the surge set can be obtained according to the above-described correspondence between voltages and capacity differences. In addition, the change speed of the capacity differences with respect to voltage can be configured according to the actual situation. Refer to FIG. 2, which shows a capacity difference versus voltage graph corresponding to different cycle counts according to an embodiment of the present disclosure. The three curves in FIG. 2 correspond to data in 100 cycles, 1000 cycles, and 2000 cycles, respectively. The set of capacity differences of the curve in region I (a-1) or the curve in region II (a-2) in the longitudinal coordinates in FIG. 2 is the surge set of the curve; the set of voltages in the transverse coordinates of each curve in regions I or II is the voltage set corresponding to the surge set of the curve.

Alternatively, when the surge set corresponding to a certain cycle count includes 22 mAh, 25 mAh and 30 mAh, and the voltage set corresponding to the surge set includes 3.1V, 3.2V and 3.3V, since the capacity difference at 3.3V is the largest, 3.3V may be a maximum-difference voltage of the voltage set, and 3.1V may be a difference-surge-initiation voltage of the voltage set (meaning the capacity differences start to surge at 3.1V).

S14, identifying a degree of the battery degradation based on the surge set and the voltage set, to obtain an identification result related to the current cycle count.

Optionally, S14 comprises: acquiring a degradation coefficient of the battery related to the current cycle count based on the surge set and voltage set in the current cycle count; and acquiring the identification result related to the current cycle count based on the degradation coefficient of the battery related to the current cycle count.

As described above, The method includes: acquiring battery data related to a current cycle count, wherein the battery data comprise battery capacities and battery voltages of the battery; acquiring, based on the battery capacities and the battery voltages, capacity differences corresponding to the battery voltages; acquiring, based on the battery voltages and the capacity differences, a surge set of the capacity differences and a voltage set corresponding to the surge set; and identifying a degree of the battery degradation based on the surge set and the voltage set, to obtain an identification result related to the current cycle count. By processing the battery data related to the current cycle count to acquire the surge set and the voltage set, and identifying the degree of the battery degradation on the basis of the surge set and the voltage set, it is possible to identify the degree of the battery degradation without the need for other specialized testing equipment, thereby reducing the cost of identification of the degree of the battery degradation, thereby simplifying the identification process.

In addition, traditional methods require the battery to be fully charged or fully discharged before analysis can take place, whereas the disclosed method for identifying the degree of the battery degradation does not have such limitations because the surge set described in the present disclosure is in the normal operation range of the battery. To ensure battery safety, batteries are typically not fully charged or fully discharged during later stages of usage. Therefore, the disclosed method for identifying the degree of the battery degradation is more applicable in real-world scenarios than traditional methods.

Figure 3:
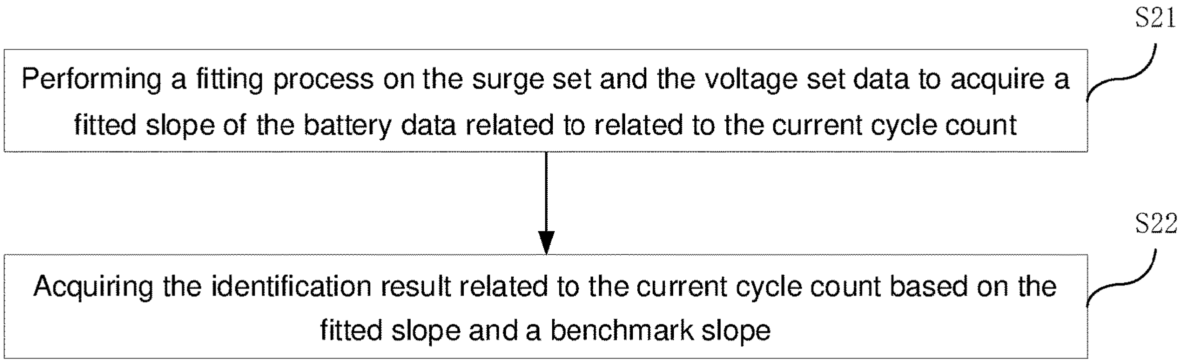
FIG. 3 shows a flowchart of identifying the degree of the battery degradation according to an embodiment of the present disclosure.

Referring to FIG. 3, as an example, the method further comprises:

S21, performing a fitting process on the surge set and the voltage set data to acquire a fitted slope of the battery data related to related to the current cycle count; and Optionally, the fitted slope may be given by:

$$Q_{diff} = m_1 \times U + m_0,\ U \in [U_1, U_2]$$

$U_1$ is difference-surge-initiation voltage, and $U_2$ is the maximum-difference voltage. $Q_{diff}$ is a capacity difference in the surge set, $m_1$ is the fitted slope, and $m_0$ is a fitting parameter of the battery.

Optionally, performing the fitting process on the surge set and the voltage set includes: acquiring the fitted slope and the fitting parameter based on the surge set and the voltage set.

S22, acquiring the identification result related to the current cycle count based on the fitted slope and a benchmark slope.

Optionally, the benchmark slope may be a fitted slope of the battery at a benchmark cycle count; for example, the current cycle count may be one of the cycle counts of 100, 1000, or 2000, so there would be three related fitted slopes. If the degree of the battery degradation at the cycle count of 1000 needs to be identified, the cycle count of 100 may be used as the benchmark cycle count, in which case, the fitted slope at the cycle count of 100 may be used as the benchmark slope. If the degree of the battery degradation corresponding to the cycle count of 2000 needs to be identified, either of the cycle count of 100 or 1000 may be used as the benchmark cycle count, in which case, both the fitted slope at the cycle count of 100 or 1000 may be used as the benchmark slope.

As can be seen from the above description, the method includes: performing the fitting process on the surge set and the voltage set to acquire the fitted slope of the battery at the current cycle count; and acquiring, based on the fitted slope and the benchmark slope, the identification results at the current cycle count. By acquiring the fitted slope of the battery at the current cycle count, the degree of the battery degradation can be quickly identified, thereby improving the identification efficiency and applicability of the method in actual industrial scenarios.

Figure 4:
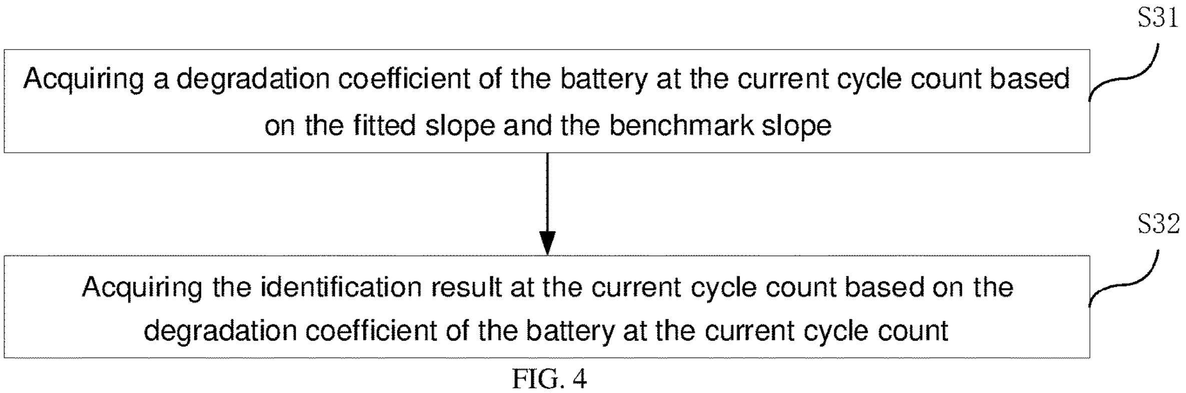
FIG. 4 shows a flowchart of obtaining an identification result corresponding to a current battery cycle count according to an embodiment of the present disclosure.

Referring to FIG. 4, the method further includes:

S31, acquiring a degradation coefficient of the battery at the current cycle count based on the fitted slope and the benchmark slope, wherein the degradation coefficient is given by:

$$k = \frac{m_1}{m_b}.$$

k denotes the degradation coefficient, $m_1$ denotes the fitted slope, and $m_b$ denotes the benchmark slope; and

S32, acquiring the identification result at the current cycle count based on the degradation coefficient of the battery at the current cycle count.

Optionally, each identification result may include categories of No Degradation, Degradation Appearing, or Severe Degradation. When the degradation coefficient is greater than or equal to 0.9, the identification result is in the category of No Degradation, when the degradation coefficient is greater than or equal to 0.8 and less than 0.9, the identification result is in the category of Degradation Appearing, and when the degradation coefficient is less than 0.8, the identification result is in the category of Severe Degradation.

As can be seen from the above description, the method includes: acquiring, based on the fitted slope and the benchmark slope, the identification coefficient at the current cycle, acquiring the identification at the current cycle count based on the degradation coefficient of the battery at the current cycle count. By introducing the degradation coefficient in acquiring the identification result, the difficulty level of acquiring the identification result is reduced, thereby simplifying the identification process, and improving the identification efficiency.

Figure 5:
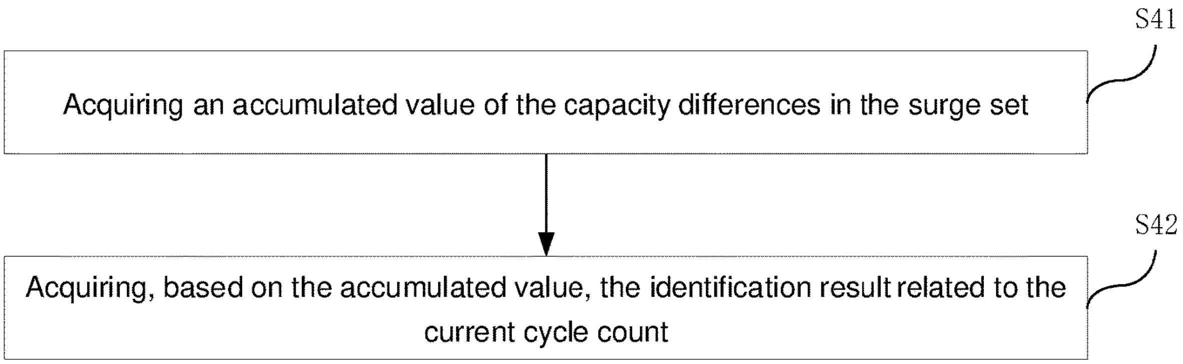
FIG. 5 shows a flowchart of identifying the degree of the battery degradation according to an embodiment of the present disclosure.

Referring to FIG. 5, as an example, the method further comprises:

S41, acquiring an accumulated value of the capacity differences in the surge set.

Optionally, the accumulated value of the capacity differences in the surge set is given by:

$$Q_{sum} = \sum_{U_1}^{U_2} Q_{diff\_U_i},\ U_i \in [U_1, U_2].$$

$U_1$ is difference-surge-initiation voltage, $U_2$ is the maximum-difference voltage. and $Q_{diff\_U_i}$ is a capacity difference at a voltage $U_i$ between $U_1$ and $U_2$.

S42, acquiring, based on the accumulated value, the identification result related to the current cycle count.

Optionally, S42 includes: acquiring, based on the accumulated value, a capacity-difference degradation ratio of the battery related to the current cycle count; acquiring, based on the capacity-difference degradation ratio, the identification result related to the current cycle count. The capacity-difference degradation ratio may be given by:

$$k_Q = \frac{Q_{sum\_now}}{Q_{sum\_bench}}.$$

$Q_{sum\_now}$ is an accumulated value of the capacity-differences at the current cycle count, and $Q_{sum\_bench}$ is an accumulated value of the capacity-differences at the benchmark cycle count; for example, there may be cycle counts of 100, 1000, and 2000. If the capacity-difference degradation ratio at the cycle count of 1000 is to be calculated, the cycle count of 100 may be used as the benchmark cycle count, at which time $Q_{sum\_bench}$ is the accumulated value of the capacity-differences corresponding to the cycle count of 100.

Optionally, each identification result may include a few categories of No Degradation, Degradation Appearing, or Severe Degradation. When the capacity-difference degradation ratio is greater than or equal to 0.9, the identification result is in the category of No Degradation. If the capacity-difference degradation ratio is greater than or equal to 0.8 and less than 0.9, the identification result is in the category of Degradation Appearing. If the capacity-difference degradation ratio is less than 0.8, the identification result is in the category of Severe Degradation.

Figure 6:
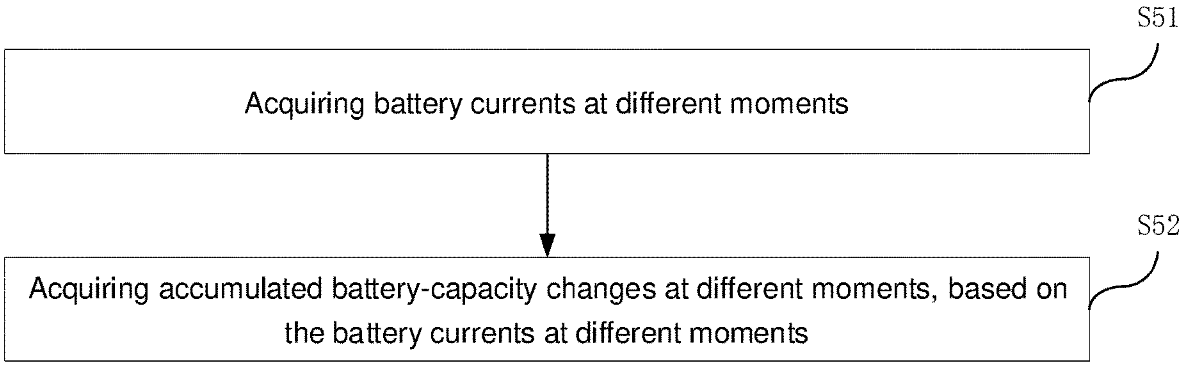
FIG. 6 shows a flowchart of acquiring battery data corresponding to the current battery cycle count according to an embodiment of the present disclosure.

Referring to FIG. 6, the method may further include:

S51, acquiring battery currents at different moments;

S52, acquiring accumulated battery-capacity changes at different moments, based on the battery currents at different moments, wherein an accumulated battery-capacity change at moment t is given by:

$$Q_t = \sum_{k=2}^{t} \frac{i_k + i_{k-1}}{2} \times \Delta t_k.$$

$i_k$ is a battery current at moment k, $i_{k-1}$ is the battery current at moment k−1, and $\Delta_{t_k}$ is a sampling interval between moment k and moment k−1, wherein k≤t. An accumulated battery-capacity change may be an accumulative increase in battery capacity from the start of charging to moment t, or an accumulative decrease in battery capacity from the start of discharging to moment t.

According to the above description, it can be understood that the method includes: acquiring the battery currents at different moments; and acquiring the accumulated battery-capacity changes at different moments, based on the battery currents at different moments Based on the battery currents at different moments, the accumulated battery-capacity changes at different moments can be obtained quickly, thereby improving the efficiency of identifying the degree of the battery degradation.

As an example, the method includes: acquiring the identification result related to the current cycle count, based on the difference-surge-initiation voltage related to the current cycle count, the difference-surge-initiation voltage related to the benchmark cycle count, and the maximum-difference voltage at the benchmark cycle count.

Optionally, the method specifically includes: acquiring a surging voltage distance ratio based on the difference-surge-initiation voltage related to the current cycle count, the difference-surge-initiation voltage related to the benchmark cycle count, and the maximum-difference voltage at the benchmark cycle count; and acquiring the identification result based on the surging voltage distance ratio. The surging voltage distance ratio may be given by:

$$\gamma = \frac{U_1^{now} - U_1^{base}}{U_2^{base} - U_1^{base}}.$$

$$U_1^{now}$$

denotes the difference-surge-initiation voltage related to the current cycle count, $$U_1^{base}$$

denotes the difference-surge-initiation voltage related to the benchmark cycle count, and $$U_2^{base}$$

denotes the maximum-difference voltage related to the benchmark cycle count.

Optionally, each identification result may include the categories of No Degradation, Degradation Appearing, or Severe Degradation. If $\gamma$ is less than or equal to 0.2, the identification result is in the category of No Degradation. If $\gamma$ is greater than 0.2 and less than or equal to 0.4, the identification result is in the category of Degradation Appearing. If $\gamma$ is greater than 0.4, the identification result is in the category of Severe Degradation.

Figure 7:
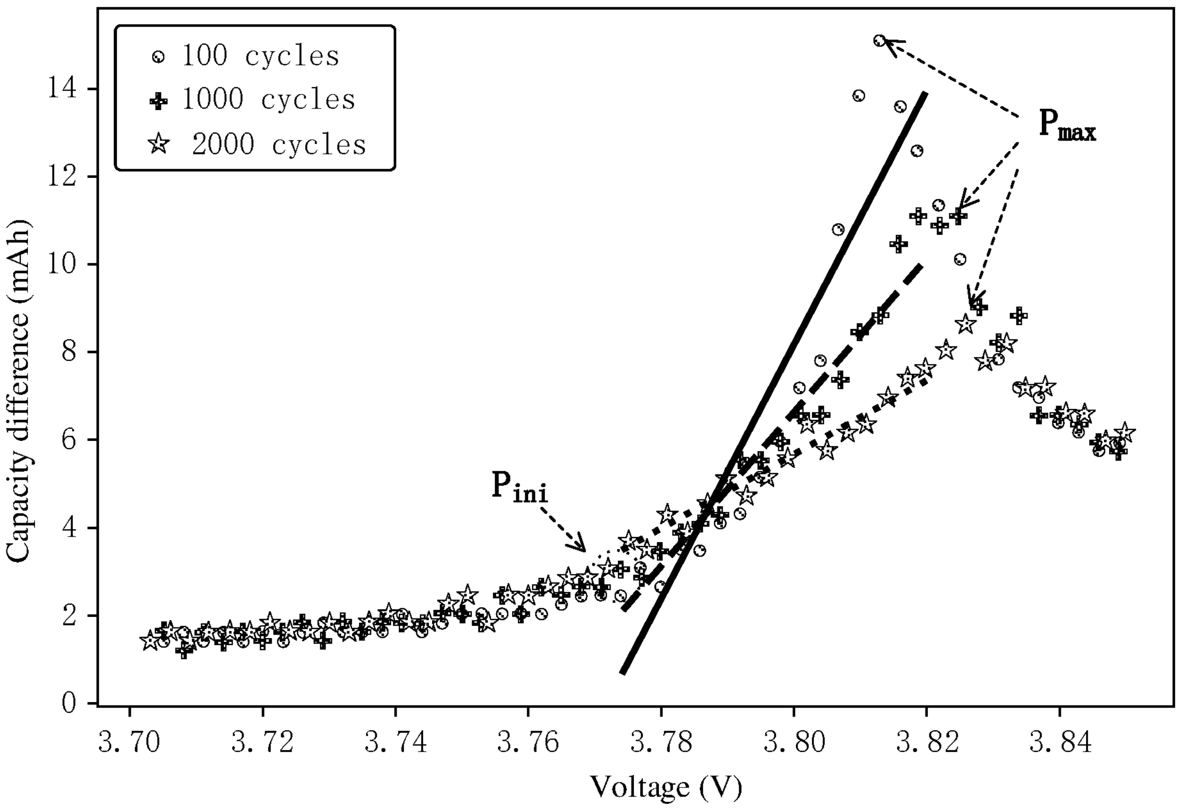
FIG. 7 shows a capacity difference versus voltage graph corresponding to different battery cycle counts according to an embodiment of the present disclosure.
Figure 8:
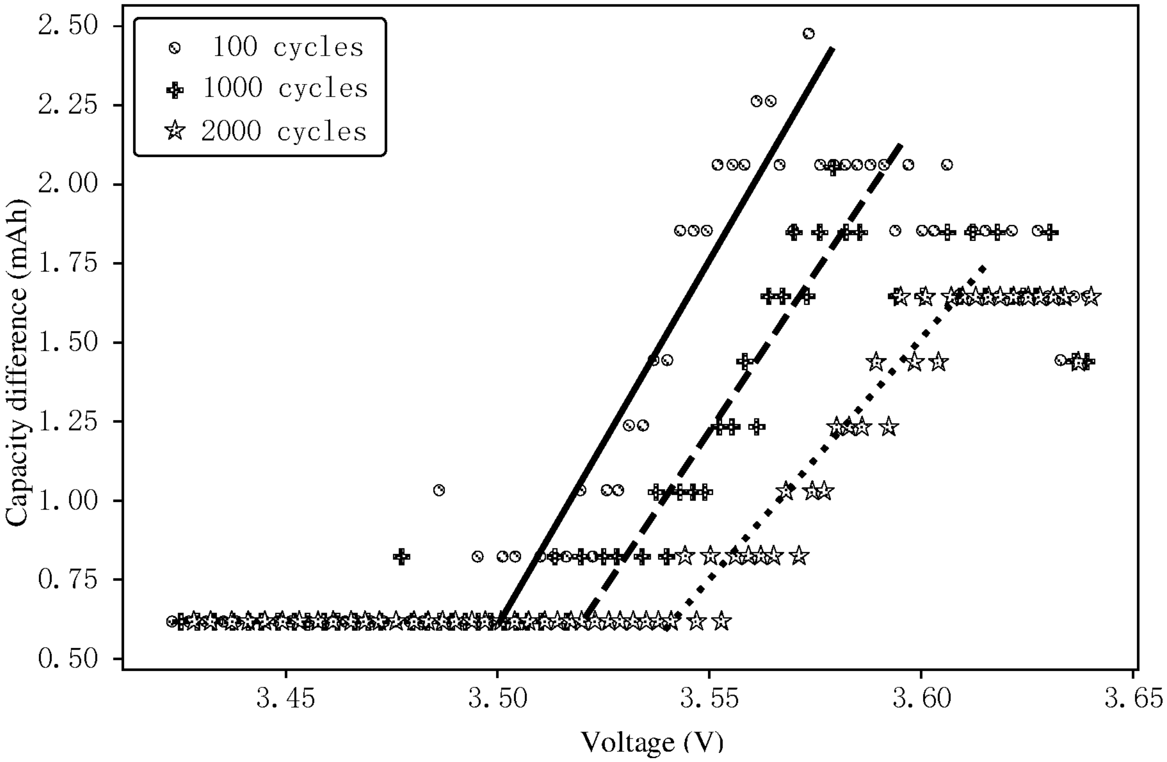
FIG. 8 shows a capacity difference versus voltage graph corresponding to different cycle counts according to an embodiment of the present disclosure.

Optionally, the method further includes: when the difference-surge-initiation voltage related to the current cycle count is the same as or differs from the difference-surge-initiation voltage related to the benchmark cycle count by one voltage unit, acquiring the first loss information, the first loss information referring to the loss during circulating lithium ions inside the battery; when the difference-surge-initiation voltage related to the current cycle count is different from the difference-surge-initiation voltage at the benchmark cycle count by more than one voltage units, acquiring a second loss information, and the second loss information refers to the loss of active materials at the positive and negative electrodes of the battery. Refer to FIGS. 7 and 8. FIG. 7 shows a capacity difference-voltage graph related to different cycle counts according to an embodiment of the present disclosure, wherein the horizontal coordinate of the point $P_{ini}$ denotes a difference-surge-initiation voltage, and the horizontal coordinates of the points $P_{max}$ denote maximum-difference voltages. As shown in FIG. 7, the cycle counts of 100, 1000, and 2000 share the same difference-surge-initiation voltage, which means the battery in FIG. 7 is experiencing loss of internal circulating lithium ions. Since the difference-surge-initiation voltages of the cycle counts of 100, 1000, and 2000 differ from each other by more than one voltage units, the battery in FIG. 8 is experiencing the loss of active materials at the positive and negative electrodes.

The term "same" as used herein should be construed to include variations and deviations from the original within the error range, such as those that are substantially the same or similar to the original.

As can be seen from the above description, the present disclosure is capable of quickly determining loss information of the battery based on the difference-surge-initiation voltage related to the current cycle count, the difference-surge-initiation voltage related to the benchmark cycle count, and the maximum-difference voltage related to the benchmark cycle count.

Figure 9:
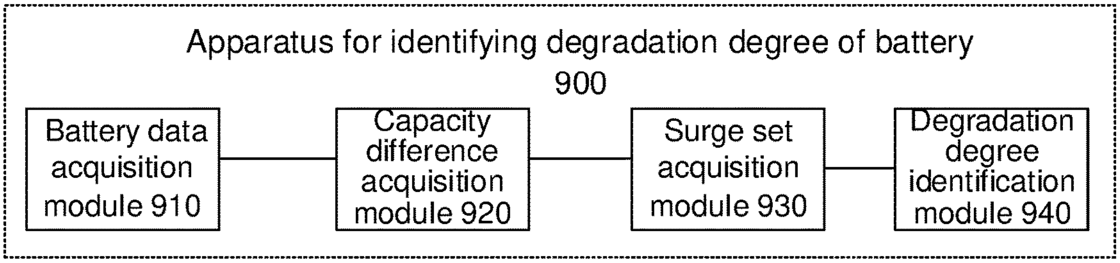
FIG. 9 shows a block diagram of an apparatus for identifying a degree of a battery degradation according to an embodiment of the present disclosure.

The present disclosure further provides an apparatus for identifying a degradation degree of a battery 900; specifically, referring to FIG. 9, the apparatus 900 includes:

- a battery data acquisition module 910, for acquiring battery data related to a current cycle count, wherein the battery data comprise battery capacities and battery voltages of the battery;
- a capacity difference acquisition module 920, for acquiring capacity differences corresponding to the battery voltages based on the battery capacities and the battery voltages;
- a surge set acquisition module 930, for acquiring a surge set of the capacity differences and a voltage set corresponding to the surge set, based on the battery voltages and the capacity differences; and
- a degradation degree identification module 940, for identifying the degree of the battery degradation based on the surge set and the voltage set to acquire an identification result related to the current cycle count.

By processing the battery data related to the current cycle count to acquire the surge set and the voltage set, and identifying the degree of the battery degradation on the basis of the surge set and the voltage set, the apparatus for identifying the degree of the battery degradation can identify the degree of the battery degradation without the need for other specialized testing equipment, thereby reducing the cost of identifying the degree of the battery degradation, and simplifying the identification process.

In addition, traditional technologies require the battery to be fully charged or discharged before analysis can take place, whereas the apparatus for identifying the degree of the battery degradation of the present disclosure does not have such limitations because the surge set described in the present disclosure is in the normal operation range of the battery. Actually, to ensure battery safety, batteries are typically not fully charged or discharged during later stages of use. Therefore, the method for identifying the degree of the battery degradation of the present disclosure is more applicable to real-world scenarios.

Based on the above description of the method for identifying a degradation degree of a battery, the present disclosure also provides a non-transitory computer-readable storage medium on which a computer program is stored. The computer program is executed by a processor to realize the method shown in FIG. 1.

Figure 10:
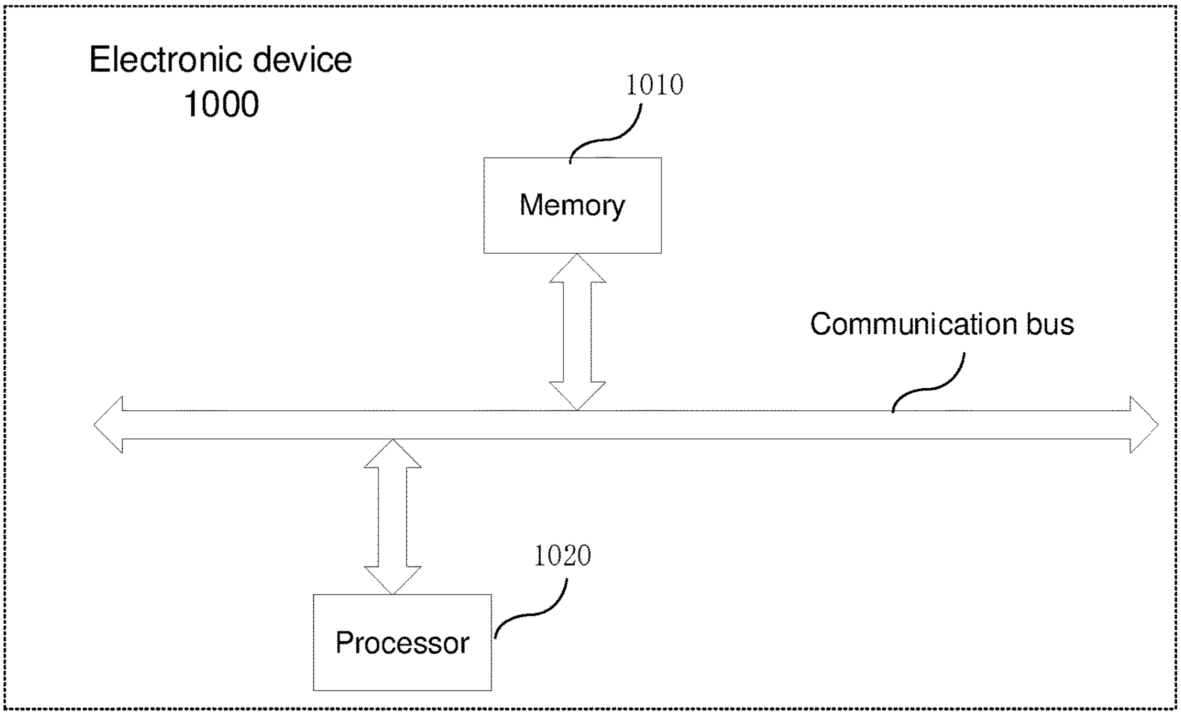
FIG. 10 shows a block diagram of an electronic device according to one embodiment of the present disclosure.

Based on the above description of the method for identifying a degradation degree of a battery, the present disclosure also provides an electronic device. Referring to FIG. 10, as an example, the electronic device 1000 includes a memory 1010 storing a computer program; and a processor 1020 communicatively coupled to the memory 1010 and configured to call the computer program to perform the method shown in FIG. 1.

The scope of the method for identifying a degradation degree of a battery as described in the present disclosure is not limited to the sequence of operations listed. Any scheme realized by adding or subtracting operations or replacing operations of the traditional techniques according to the principle of the present disclosure is included in the scope of the present disclosure.

In summary, the method, apparatus, medium and electronic device of the present disclosure for identifying a degradation degree of a battery is used to identify a degradation degree of a battery. Therefore, the present disclosure effectively overcomes various shortcomings of the prior art and has a high industrial value.

The above-mentioned embodiments are merely illustrative of the principle and effects of the present disclosure instead of restricting the scope of the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

The invention claimed is:

1. A method for identifying a degree of a battery degradation, wherein the method is performed by a battery management system, the method comprising:

acquiring, by a built-in chip of the battery management system, battery data related to a current cycle count, wherein the battery data comprise battery capacities and battery voltages;

acquiring, based on the battery capacities and the battery voltages, capacity differences corresponding to the battery voltages; wherein the battery voltages increase incrementally by a voltage unit, and wherein acquiring the capacity differences is performed when the battery voltages increase incrementally by the voltage unit;

acquiring, based on the battery voltages and the capacity differences, a surge set of the capacity differences and a voltage set corresponding to the surge set; and identifying the degree of the battery degradation based on the surge set and the voltage set, and obtaining an identification result related to the current cycle count.

2. The method for identifying the degree of the battery degradation according to claim 1, wherein identifying the degree of the battery degradation further comprises:

performing a fitting process on the surge set and the voltage set to acquire a fitted slope of the battery related to the current cycle count; and wherein obtaining the identification result related to the current cycle count is performed based on the fitted slope and a benchmark slope of the battery.

3. The method for identifying the degree of the battery degradation according to claim 2, wherein the fitted slope is obtained by the following formula:

$$Q_{diff} = m_1 \times U + m_0,\quad U \in [U_1, U_2]$$

wherein, $U_1$ is a difference-surge-initiation voltage, and $U_2$ is a maximum-difference voltage, $Q_{diff}$ is a capacity difference in the surge set, $m_1$ is the fitted slope, and $m_o$ is a fitting parameter of the battery.

4. The method for identifying the degree of the battery degradation according to claim 2, wherein obtaining the identification result related to the current cycle count further comprises:

acquiring a degradation coefficient of the battery related to the current cycle count based on the fitted slope and the benchmark slope, wherein the degradation coefficient is provided by:

$$k = \frac{m_1}{m_b},$$

wherein k denotes the degradation coefficient, $m_1$ denotes the fitted slope, and $m_b$ denotes the benchmark slope; and wherein obtaining the identification result related to the current cycle count is further performed based on the degradation coefficient of the battery related to the current cycle count.

5. The method for identifying the degree of the battery degradation according to claim 1, wherein identifying the degree of the battery degradation comprises:

acquiring an accumulated value of the capacity differences in the surge set; and obtaining the identification result related to the current cycle count based on the accumulated value of the capacity differences in the surge set.

6. The method for identifying the degree of the battery degradation according to claim 1, wherein acquiring the battery data related to the current cycle count comprises:

acquiring battery currents at different moments;

acquiring accumulated battery-capacity changes at the different moments, based on the battery currents at the different moments, wherein one of the accumulated battery-capacity changes at a moment t is given by:

$$Q_t = \sum_{k=2}^{t} \frac{i_k + i_{k-1}}{2} \times \Delta t_k$$

wherein $i_k$ is a battery current at a moment k, $i_{k-1}$ is the battery current at a moment k−1, and $\Delta_{t_k}$ is a sampling interval between the moment k and the moment k−1, wherein k≤t.

7. A non-transitory computer-readable storage medium, which stores a computer program, wherein when the computer program is executed by a processor, the method for identifying the degree of the battery degradation is implemented according to claim 1.

8. An electronic device, comprising:

a memory, wherein a computer program is stored in the memory; and a processor, communicatively connected to the memory, wherein the processor is configured to call the computer program to perform the method for identifying the degree of the battery degradation according to claim 1.

9. The method for identifying the degree of the battery degradation according to claim 1, wherein acquiring battery data related to a current cycle count further comprises: receiving battery voltages and battery currents of the battery at different sampling moments collected by the battery management system; and acquiring battery capacities corresponding to the battery voltages based on an initial charge state of the battery and the battery currents.

* * * * *